(12) United States Patent
Lin et al.

(10) Patent No.: US 8,519,500 B2
(45) Date of Patent: Aug. 27, 2013

(54) IMAGE SENSOR WITH CORRECTING LENS AND FABRICATION THEREOF

(75) Inventors: Yu-Tsung Lin, Taichung County (TW); Hung-Chao Kao, Taipei (TW); Ming-I Wang, Taipei County (TW); Kuo-Yuh Yang, Hsinchu (TW)

(73) Assignee: United Microelectronics Corp., Science-Based Industrial Park, Hsinchu (TW)

( * ) Notice: Subject to any disclaimer, the term of this patent is extended or adjusted under 35 U.S.C. 154(b) by 248 days.

(21) Appl. No.: 11/945,099

(22) Filed: Nov. 26, 2007

(65) Prior Publication Data

US 2009/0134484 A1    May 28, 2009

(51) Int. Cl.
*H01L 31/00*    (2006.01)

(52) U.S. Cl.
USPC ....... 257/432; 257/98; 257/100; 257/E33.069

(58) Field of Classification Search
USPC .......................................................... 257/432
See application file for complete search history.

(56) References Cited

U.S. PATENT DOCUMENTS

| | | | | |
|---|---|---|---|---|
| 5,337,186 A * | 8/1994 | Oikawa et al. | ................ | 359/628 |
| 5,536,455 A * | 7/1996 | Aoyama et al. | ................ | 264/1.7 |
| 5,694,246 A * | 12/1997 | Aoyama et al. | ................ | 359/619 |
| 5,963,577 A * | 10/1999 | Snyder et al. | ................ | 372/101 |
| 6,086,204 A * | 7/2000 | Magnante | ................ | 351/212 |
| 6,124,974 A * | 9/2000 | Burger | ................ | 359/621 |
| 6,617,189 B1 | 9/2003 | Chen | | |
| 6,744,109 B2 * | 6/2004 | Barton et al. | ................ | 257/436 |
| 6,917,695 B2 | 7/2005 | Teng | | |
| 6,940,654 B1 * | 9/2005 | Tang | ................ | 359/619 |
| 7,068,432 B2 * | 6/2006 | Boettiger et al. | ................ | 359/619 |
| 7,177,095 B2 | 2/2007 | Sugiyama | | |
| 7,462,086 B2 * | 12/2008 | Mueller-Mach et al. | ........ | 445/23 |
| 2004/0223071 A1 * | 11/2004 | Wells et al. | ................ | 348/340 |
| 2005/0128509 A1 * | 6/2005 | Tokkonen et al. | ........... | 358/1.15 |
| 2005/0179962 A1 * | 8/2005 | Williamson | ................ | 358/473 |
| 2006/0081955 A1 * | 4/2006 | Hong | ................ | 257/432 |
| 2007/0069109 A1 * | 3/2007 | Lee | ................ | 250/208.1 |
| 2007/0166868 A1 | 7/2007 | Ko | | |
| 2008/0191299 A1 * | 8/2008 | Parks | ................ | 257/432 |

* cited by examiner

*Primary Examiner* — Julio J Maldonado
*Assistant Examiner* — Mohammad Choudhry
(74) *Attorney, Agent, or Firm* — Winston Hsu; Scott Margo (57) ABSTRACT

An image sensor with at least one correcting lens and a method for fabricating the same are described. The image sensor includes a substrate with an array of microlenses thereon and at least one correcting lens disposed over the substrate covering the microlens array. In the fabricating method, a substrate having formed with a microlens array thereon is provided, and then at least one correcting lens is disposed over the substrate covering the microlens array. The at least one correcting lens can, in use of the image sensor, shift the incident direction of light to a microlens in edge parts of the array of microlenses toward the normal line direction of the image sensor.

21 Claims, 8 Drawing Sheets

IMAGE SENSOR WITH CORRECTING LENS AND FABRICATION THEREOF

BACKGROUND OF THE INVENTION

1. Field of Invention

This invention relates to image recording apparatuses, and more particularly to an image sensor with at least one correcting lens and to a method of fabricating the same. The at least one correcting lens can shift, toward the normal line direction of the image sensor, the incident direction of light to a microlens in the edge parts of a microlens array that would otherwise overly deviate from the normal line direction.

2. Description of Related Art

In a semiconductor-type image recording apparatus like a charge-coupled device (CCD) or CMOS image recording apparatus, a microlens array is usually disposed over the array of photosensing devices to enhance the sensitivity of the same, wherein one microlens focuses light on one photosensing device.

Figure 1:
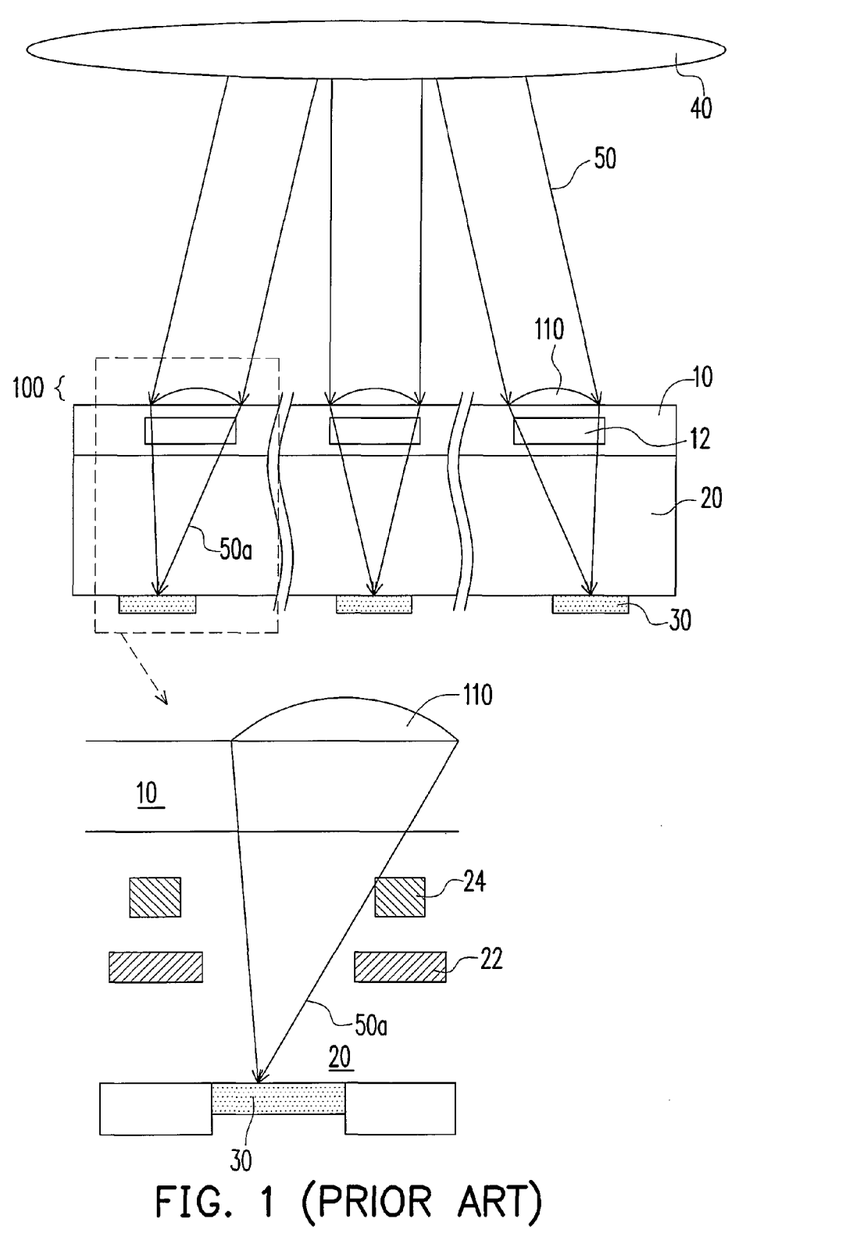
FIG. 1 shows a part of a CMOS image recording apparatus in the prior art.

Referring to FIG. 1 that schematically shows a part of a CMOS image recording apparatus in the prior art, a microlens array 100 is formed on a transparent base layer 10, which includes a color filter array 12 and other functional layers over a multi-level interconnect structure 20 including a first-level interconnect layer 22 and a second-level interconnect layer 24 over a photodiode array 30. The CMOS transistors are omitted in the figure for simplicity. The eyepiece 40 of the CMOS image recording apparatus is disposed above the microlens array 100, apart from the latter by a certain distance.

Because the incident direction of the light incident to a microlens 110 in an edge part, especially in a corner portion of an edge part, of the microlens array 100 overly deviates from the normal line direction of the image sensor so that light can't be focused well to the corresponding photodiode 30 directly under it, the microlens 110 is laterally displaced relative to the underlying photodiode 30 in the prior art to make the light well focus on the latter, as shown in FIG. 1. This makes the exit light 50a from the microlens 110 partially blocked by the second-level interconnect layer 24, thus lowering the recording accuracies of images.

The light-blocking issue can be solved by laterally displacing the portions of the $2^{nd}$-level interconnect layer 24 under the edge parts of the microlens array 100, but the circuit design would become much more complicated by doing so.

SUMMARY OF THE INVENTION

Accordingly, this invention provides an image sensor that includes at least one correcting lens, which can correct overly inclined incident light to a microlens in edge parts of the array so that the microlens does not have to be displaced laterally.

This invention also provides a method of fabricating an image sensor with at least one correcting lens of this invention.

The image sensor of this invention includes a substrate having thereon an array of microlenses and at least one correcting lens disposed over the substrate covering the microlens array.

The method of fabricating an image sensor of this invention is as follows. A substrate having formed with an array of microlenses thereon is provided, and then at least one correcting lens is disposed over the substrate covering the microlens array.

The least one correcting lens may include only one correcting lens covering the whole microlens array, or may at least include four correcting lenses over the four corner of the microlens array. In some embodiments, the at least one correcting lens is directly formed over the substrate. In other embodiments, the at least one correcting lens is fixed onto the substrate after being formed. The at least one correcting lens can be designed to be able to shift the incident direction of light to a microlens in the array substantially to the normal line direction of the image sensor in use of the image sensor.

Since the at least one correcting lens can shift, toward the normal line direction of the image sensor, the incident direction of light to a microlens in edge parts of the microlenses array that would overly deviate from the normal line direction in absence of the at least one correcting lens, the microlens does not have to be displaced laterally and the interconnect circuit does not have to be redesigned.

In order to make the aforementioned and other objects, features and advantages of the present invention comprehensible, a preferred embodiment accompanied with figures is described in detail below.

DESCRIPTION OF EMBODIMENTS

First Embodiment

Figure 2:
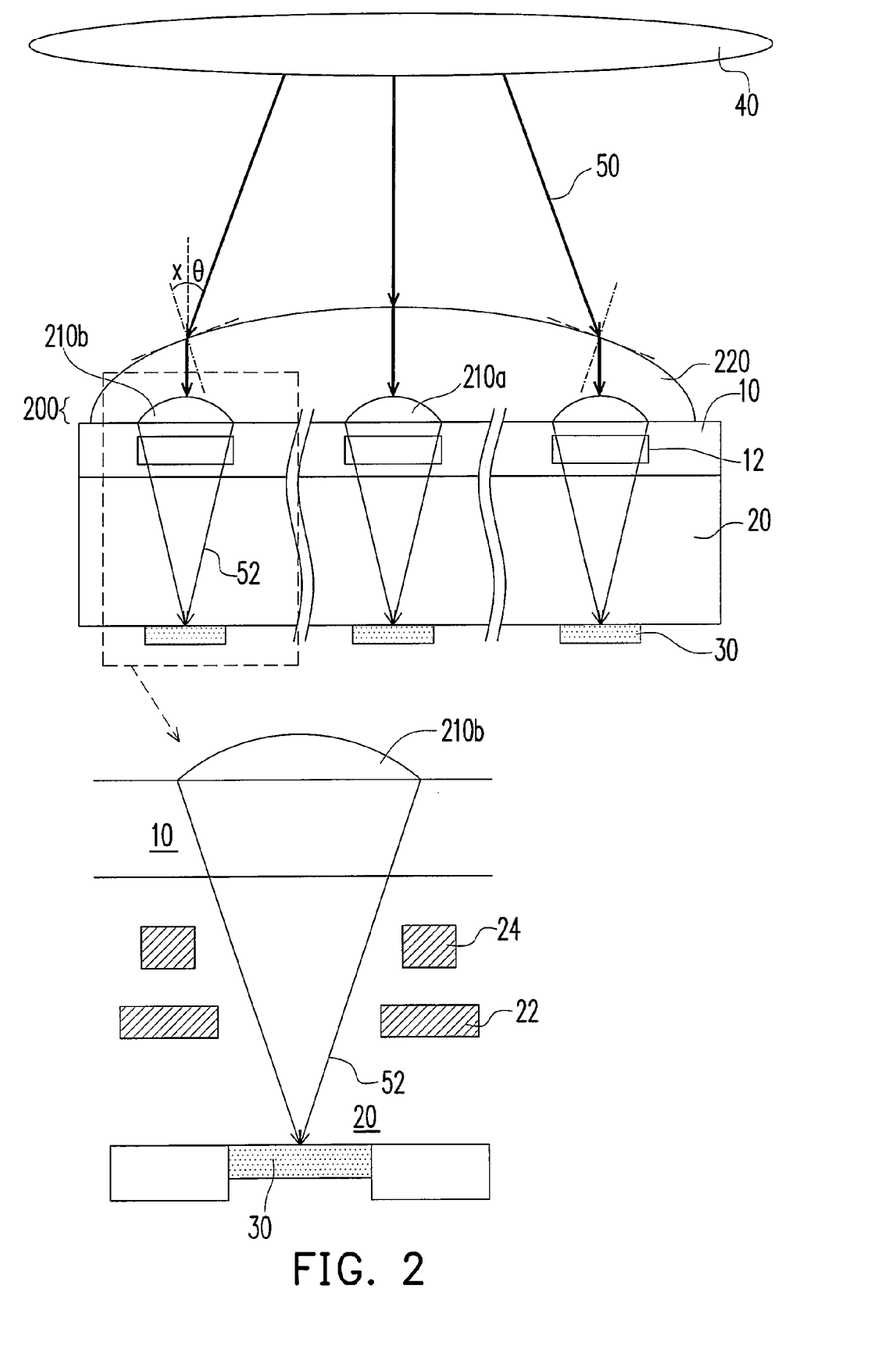
FIG. 2 illustrates a CMOS image sensor according to a first embodiment of this invention where only one correcting lens is directly formed over the substrate thereof.

In the first embodiment, only one correcting lens is directly formed over the substrate of one image sensor having been formed with an array of microlenses thereon. FIG. 2 illustrates a CMOS image sensor according to the first embodiment.

Referring to FIG. 2, the parts 10-40 are similar to those in FIG. 1 of the prior art and are not described again. After the base layer 10 including the color filter array 12 and a microlens array 200 are formed, a correcting lens 220 is disposed over the base layer 10 covering the microlens array 200. The microlens array 200 has a central part wherein any microlens 210a has a light incident direction within a certain range around the normal line direction of the image sensor to focus light well on the corresponding photodiode 30 without a lateral displacement, and edge parts where any microlens 210b has an incident angle outside of the certain range and requires, in absence of a correcting lens 220, a lateral displacement to focus light well on the corresponding photodiode 30. The correcting lens 220 is designed to shift an incident angle of any microlens 210b in the edge parts to an angle within the certain range, so that a microlens 210b in the edge parts of the microlens array 200 does not have to be laterally displaced relative to the corresponding photodiode 30 and the interconnect structures under the a microlens 210b does not have to be redesigned.

Ideally, the correcting lens 220 is designed so that the any microlens 210b in the edge parts has an incident light in the normal line direction of the base layer 10 and the exit light 52 from the microlens 210b focuses at center of the corresponding photodiode 30. In such an ideal case, the satisfactory normal angle "x" at a point of the surface of the correcting lens 220 corresponding to a light incident angle "θ" is calculated according to the Snell's law:

$$n_a \sin(\theta+x) = n_h \sin x \to \ldots \to x = \tan^{-1}[\sin \theta/(n_h/n_a - \cos \theta)],$$

wherein $n_a$ is the refractive index of air and $n_h$ is the refractive index of the material of the correcting lens 220. Accordingly, a portion of the correcting lens 220 right above a microlens 210b in a corner portion of the edge parts of the microlens array 200 that is subjected to most inclined incident light has a largest normal angle, and a portion of the same right above a microlens 210b in a non-corner portion of the edge parts of the microlens array 200 subjected to less inclined incident light has a smaller normal angle.

Of course, in a real process, it is not necessary to make any microlens 210b in the edge parts of the microlens array 200 have an incident direction the same as the normal line direction of the image sensor, and it is enough to make any microlens 210b have an incident angle within a range allowing sufficiently good focus. Accordingly, one normal angle can be set for numerous microlenses 210b whose incident angles are within a certain range, so that the surface of the correcting lens 220 may be composed of merely several straight segments in a cross-sectional view and can be easily shaped.

Moreover, the correcting lens 220 may include an organic material, which may be a heat- or UV-curable polymeric material, or alternatively a positive photoresist material. It is noted that when each microlens 210a/b is a convex lens as usual, the refractive index of the material of the correcting lens 220 has to be smaller than that of the material of the microlenses 210a/b for light focusing onto the photodiodes 30.

FIGS. 4A-4D illustrate a process flow of a method of fabricating an image sensor according to the $1^{st}$ embodiment where one die is disposed with only one correcting lens, wherein an organic material is applied to the substrate and then press-molded to form a correcting lens covering all the microlenses.

Figure 4A:
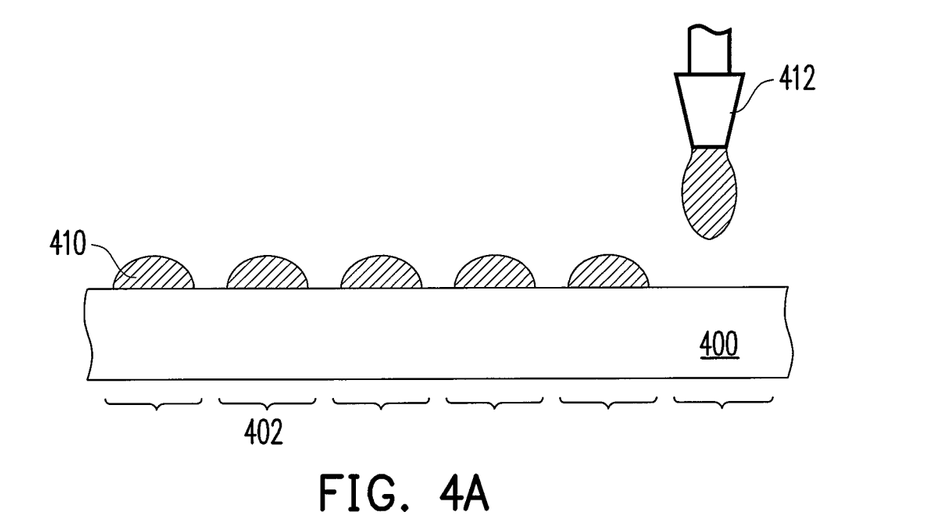
FIGS. 4A-4D illustrate a process flow of a method of fabricating an image sensor according to the first embodiment of this invention where one die is disposed with only one correcting lens.

Referring to FIG. 4A, a curable polymeric material 410 that may be heat- or UV-curable is dropped onto respective dies 402 of a wafer 400 that have been formed with microlens arrays (very small and not shown) thereon. It is possible to use one nozzle 412 or an array of nozzles (not shown) to drop the curable polymeric material 410.

Figure 4B:
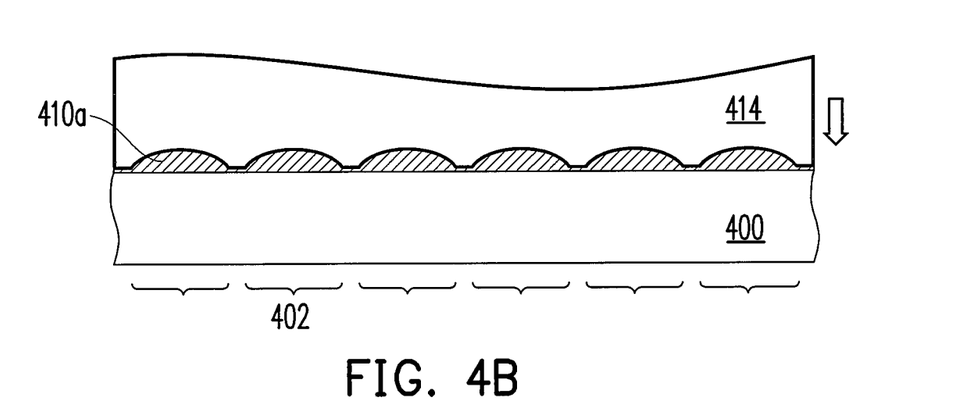

Referring to FIG. 4B, a template 414 of an array of correcting lenses, in which a cavity for defining a correcting lens has a surface shape designed in the above rule, is used to press the curable polymeric material 410 to form an array of structures 410a each having the shape of a correcting lens. Alternatively, a template of only one correcting lens is used.

Figure 4C:
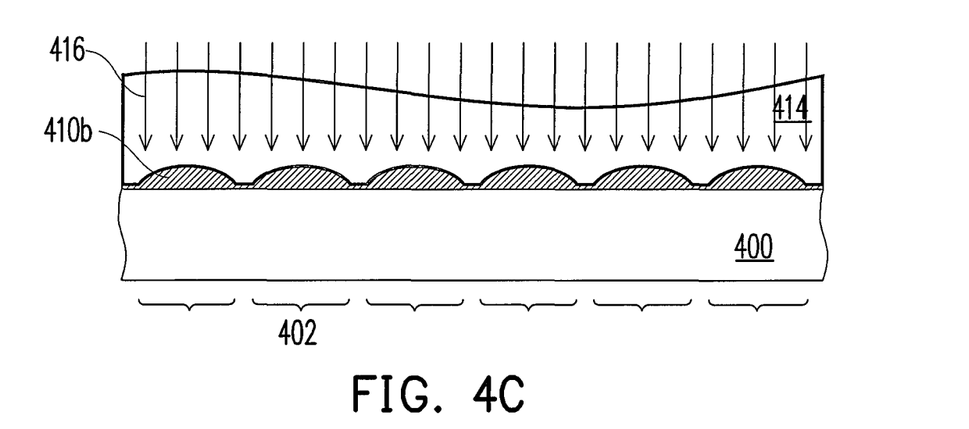

Referring to FIG. 4C, heat or UV-light 416 is applied to or through the template 414 to cure the structures 410a and form an array of correcting lenses 410b, wherein the template 414 has to be transparent when a UV-curable polymeric material and UV-light 416 are adopted.

Figure 4D:
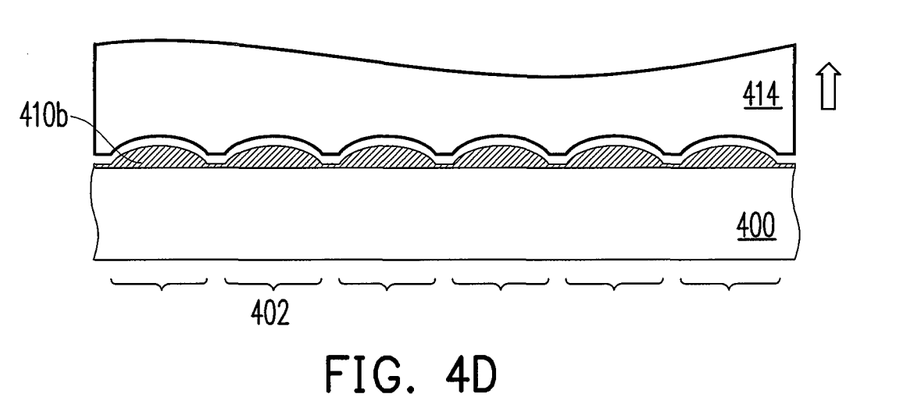

Referring to FIG. 4D, after the correcting lenses 410b are formed with heat- or UV-curing, the template 414 is lifted away from the lenses 410b as formed and moved to above next group (not shown) of dies 402 for the correcting-lens fabrication thereof.

Figure 5A:
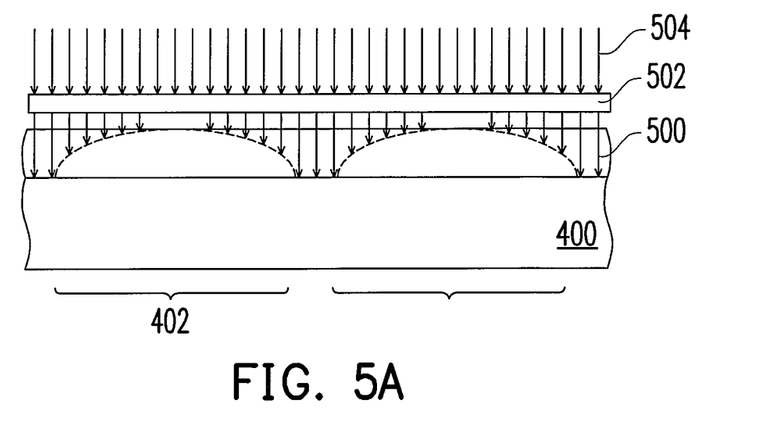
FIGS. 5A-5B illustrate a process flow of another method of fabricating an image sensor according to the first embodiment of this invention.
Figure 5B:
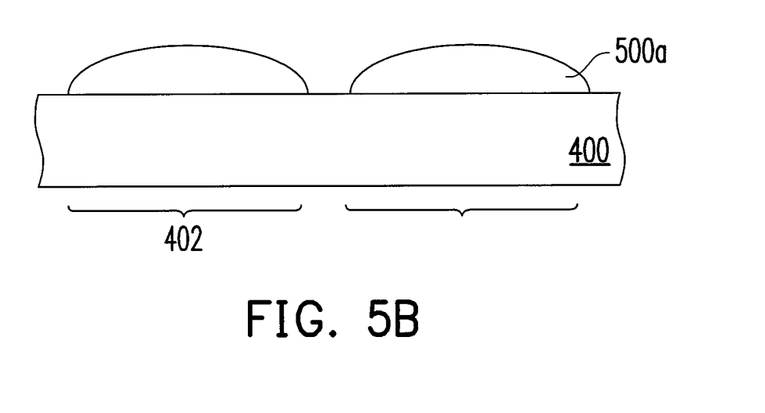

FIGS. 5A-5B illustrate a process flow of another method of fabricating an image sensor according to the first embodiment of this invention where one die is disposed with only one correcting lens.

Referring to FIG. 5A, after a wafer 400 having arrays of microlenses (too small and not show) thereon is provided, a positive photoresist layer 500 is formed over the substrate 400 and then exposed with exposure light 504 and a photomask 502 having a transparency distribution capable of defining shapes of a plurality of correcting lenses, while a portion of the photomask 502 with a higher transparent causes more intense irradiation on the corresponding portion of the positive photoresist layer 500 and removes a larger thickness of the corresponding portion of the photoresist layer 500.

Referring to FIG. 5B, a development step is performed to the exposed positive photoresist layer 500 to form correcting lenses 500a. It is noted that the photomask 502 can be designed to define an $m_1 \times m_2 (m_1 + m_2 \geq 3)$ array of correcting lenses once, as shown in FIG. 5A, or be designed to define only one correcting lens once (not shown).

Second Embodiment

Figure 3:
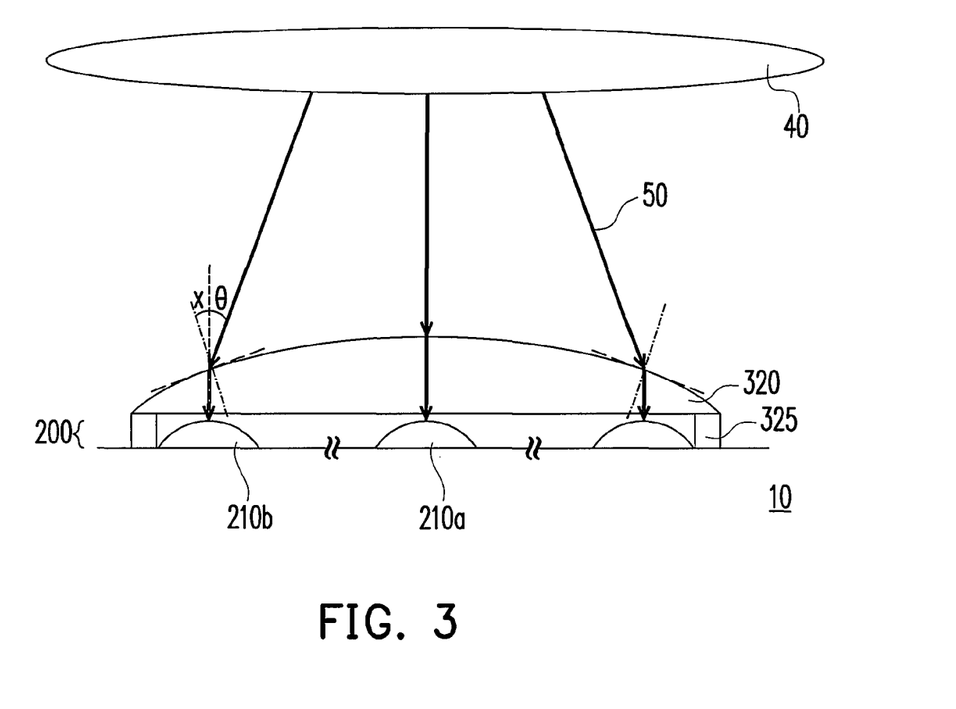
FIG. 3 shows a part of a CMOS image sensor according to a second embodiment of this invention where only one correcting lens is fixed onto the substrate thereof.

In the second embodiment of the invention, the correcting lens is fixed to a substrate having been formed with a microlens array thereon after being formed. FIG. 3 shows a part of a CMOS image sensor according to the second embodiment where only one correcting lens is fixed onto the substrate thereof after being formed.

Referring to FIG. 3, the correcting lens 320 may be fixed onto the base layer 10 via an adhesive 325, wherein granular spacers (not shown) may also be used to keep a distance between the microlens array 200 and the bottom of the correcting lens 320. The correcting lens 320 may include an organic material or an inorganic material that is usually used to fabricating optical lenses, wherein the inorganic material may be glass.

The surface shape of a correcting lens 320 is designed as in the first embodiment. However, the refractive index of the material of the correcting lens 320 is not limited to be larger or smaller than that of the material of the microlenses 210a/b corresponding to the shape (convex or concave) of each microlens 210a/b, because the light does not go into a microlens 210a/b directly from the correcting lens 320 but firstly goes into the air from the correcting lens 320 and then into the microlens 210a/b from the air.

Figure 6A:
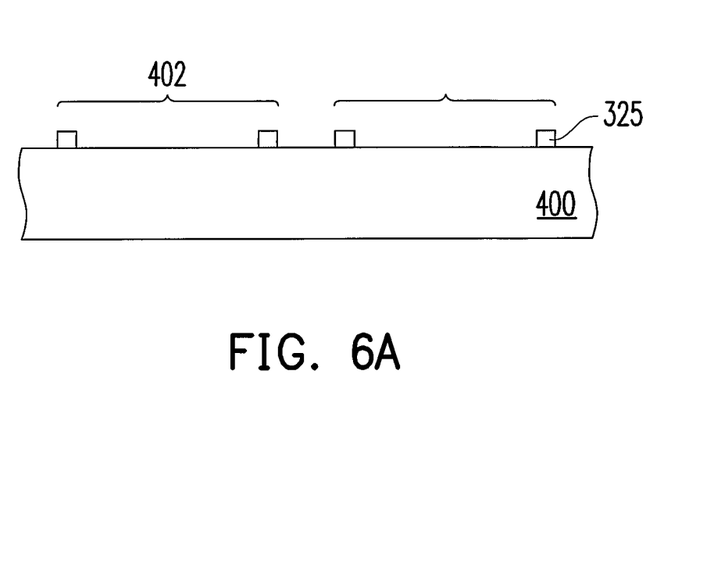
FIGS. 6A-6B illustrate a process flow of a method of fabricating an image sensor according to the second embodiment of this invention where one die is disposed with only one correcting lens.
Figure 6B:
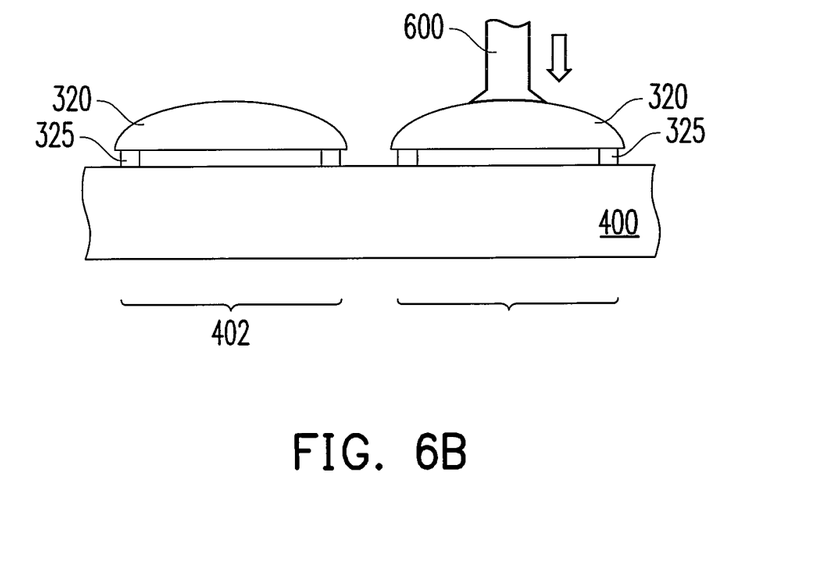

FIGS. 6A-6B illustrate a process flow of a method of fabricating an image sensor according to the second embodiment of this invention where one die is disposed with only one correcting lens.

Referring to FIG. 6A, after a wafer 400 having arrays of microlenses (too small and not show) thereon is provided, an adhesive 325 is applied at the edges of each die 402, wherein the adhesive 325 may be a heat- or UV-curable adhesive. Some granular spacers (not shown) may also be placed on the substrate 400 to keep a certain distance between the microlens array and the bottom of the correcting lens disposed later.

Referring to FIG. 6B, a correcting lens 320 is fixed onto each die 325 via the adhesive 325 on the same. When the adhesive 325 is a heat- or UV-curable adhesive, heating or UV-irradiation is required for the fixing. The holders 600 for placing a correcting lens 320 on a die 402 may utilize suction means to hold and remove the correcting lens 320. In addition, the correcting lens 320 may include an organic material or an inorganic material usually used to fabricating optical lenses, wherein the inorganic material may be glass.

Third Embodiment

Figure 7A:
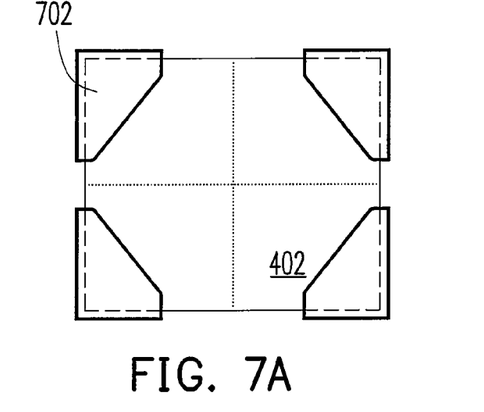
FIGS. 7A-7C illustrate three examples of a die having a plurality of correcting lenses thereon as an image sensor according to a third embodiment of this invention.
Figure 7B:
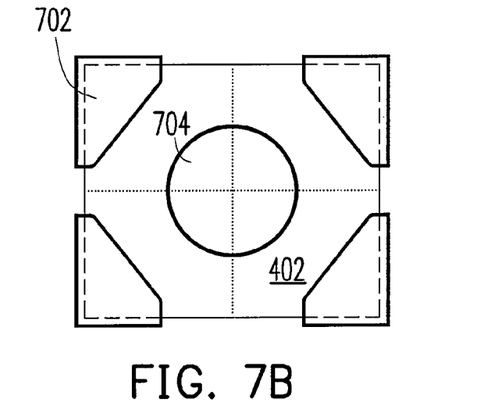
Figure 7C:
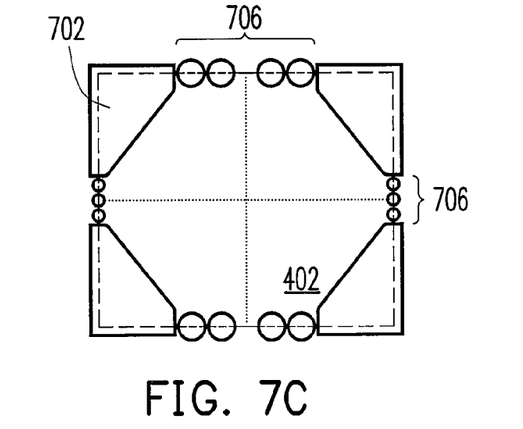

FIGS. 7A-7C illustrate three examples of a die having more than one correcting lenses thereon as an image sensor according to the third embodiment of this invention.

Referring to FIG. 7A, there are four correcting lenses 702 disposed over the four corners of a die. 402 (or the microlens array) to correct the incident light direction of the corner microlenses whose incident light directions deviate most from the normal line direction of the image sensor. The surface shape of each correcting lens 702 may be design based on the rule $\{x=\tan^{-1}[\sin\theta/(n_{f_t}/n_a-\cos\theta)]\}$ mentioned in the above description of the first embodiment.

Moreover, as shown in FIGS. 7B and 7C, it is possible to further dispose one more correcting lens 704 above a central part of the microlens array or further dispose a plurality of groups of correcting lenses 706 between the four corner correcting lenses 702. The surface shape of each correcting lens 704 or 706 may be design based on the rule $\{x=\tan^{-1}[\sin\theta/(n_{f_t}/n_a-\cos\theta)]\}$ mentioned in the description of the first embodiment.

In addition, the correcting lenses 702-706 may be directly formed on the die 402, possibly by the press-molding or lithographic method described in the first embodiment of this invention. Alternatively, the correcting lenses 702-706 are fixed to the die 402, possibly with a modified version of the method described in the second embodiment.

In the above three embodiments, since the at least one correcting lens shifts, toward the normal line direction of the image sensor, the incident angle of light to a microlens in the edge parts of the microlens array that would otherwise overly deviate from the normal line direction, the microlens does not have to be laterally displaced and the interconnect circuit does not have to be redesigned.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. An image sensor, comprising:
a substrate having an array of microlenses thereon, wherein each microlens has a flat bottom; and
at least one correcting lens disposed over the substrate covering the microlens array, the correcting lens and the microlens array both in direct contact with the surface of the substrate, and the bottoms of the microlenses and the correcting lens are even with the surface of the substrate, wherein each correcting lens has only one singular curvature and optical power; and
at least one photodiode disposed under the substrate for receiving a light, wherein the photodiode is laterally aligned with a corresponding microlens, and the curvature of the correcting lenses at each of the different portions thereof is matched with the curvature of each of the microlenses located directly under the portion of the correcting lens, from a plurality of edge parts to a central part of the array of the microlenses, and the distance of each microlens to the photodiode is the same as the focal length of the microlens, so as to allow each microlens to collect light into a spot on the photodiode.

2. The image sensor of claim 1, wherein the at least one correcting lens shifts an incident direction of light to a microlens in the array substantially to a normal line direction of the image sensor in use of the image sensor.

3. The image sensor of claim 1, wherein the at least one correcting lens includes four correcting lenses above four corners of the array of microlenses.

4. The image sensor of claim 3, wherein the at least one correcting lens further includes one correcting lenses above a central part of the array of microlenses, or further includes a plurality of groups of correcting lenses between the four correcting lenses.

5. The image sensor of claim 1, wherein the at least one correcting lens is directly formed over the substrate.

6. The image sensor of claim 5, wherein the at least one correcting lens comprises an organic material.

7. The image sensor of claim 6, wherein the organic material is a heat- or UV-curable polymeric material.

8. The image sensor of claim 6, wherein the organic material is formed from a positive photoresist material.

9. The image sensor of claim 1, wherein the at least one correcting lens is fixed onto the substrate after being formed.

10. The image sensor of claim 9, wherein the at least one correcting lens comprises an organic material or an inorganic material.

11. The image sensor of claim 10, wherein the inorganic material is glass.

12. The image sensor of claim 9 wherein the at least one correcting lens is fixed onto the substrate via an adhesive.

13. A method of fabricating an image sensor, comprising:
providing a substrate having formed with an array of microlenses thereon, wherein each microlens has a flat bottom;
disposing at least one correcting lens over the substrate covering the microlenses, wherein the correcting lens and the microlens array are both in direct contact with the surface of the substrate, and the bottoms of the microlenses and the correcting lens are even with the surface of the substrate, and each correcting lens has only one singular curvature and optical power, wherein disposing the at least one correcting lens comprises directly forming the at least one correcting lens over the substrate, and further comprises:
forming a positive photoresist layer covering the microlenses;
exposing the positive photoresist layer with a photomask having a transparency distribution capable of defining a shape of the at least one correcting lens; and
developing the at least one correcting lens; and
receiving a light with at least one photodiode disposed under the substrate, wherein the photodiode is laterally aligned with a corresponding microlens, and the curvature of the correcting lenses at each of the different portions thereof is matched with the curvature of each of the microlenses located directly under the portion of the correcting lens, from a plurality of edge parts to a central part of the array of the microlenses, and the distance of each microlens to the photodiode is the same as the focal length of the microlens, so as to allow each microlens to collect light into a spot on the photodiode.

14. The method of claim 13, wherein the at least one correcting lens shifts an incident direction of light to a microlens in the array substantially to a normal line direction of the image sensor in use of the image sensor.

15. The method of claim 13, wherein the at least one correcting lens includes four correcting lenses above four corners of the array of microlenses.

16. The method of claim 15, wherein the at least one correcting lens further includes one correcting lenses above a central part of the array of microlenses, or further includes a plurality of groups of correcting lenses between the four correcting lenses.

17. The method of claim 13, wherein disposing the at least one correcting lens comprises:
   applying an organic material to the substrate; and
   press-molding the organic material to form the at least one correcting lens.

18. The method of claim 17, wherein the organic material is a heat-or UV-curable polymeric material.

19. The method of claim 18, wherein press-molding the organic material comprises:
   press the organic material by a template of the at least one correcting lens;
   cure the organic material to form the at least one correcting lens; and
   lifting the template away from the at least one correcting lens.

20. The method of claim 13, wherein disposing the at least one correcting lens comprises:
   providing the at least one correcting lens; and
   fixing the at least one correcting lens onto the substrate.

21. The method of claim 20, wherein the at least one correcting lens comprises an organic material or an inorganic material.

* * * * *